United States Patent [19]

Negri

[11] 4,035,573
[45] July 12, 1977

[54] ELECTRON BEAM HEATING APPARATUS HAVING MEANS FOR SWEEPING THE BEAM SPOT

[75] Inventor: Sergio Negri, Turin, Italy

[73] Assignee: Varian Associates, Inc., Palo Alto, Calif.

[21] Appl. No.: 680,009

[22] Filed: Apr. 26, 1976

[30] Foreign Application Priority Data

Apr. 29, 1975 Italy .................... 22825/75

[51] Int. Cl.² .................... H01J 37/305
[52] U.S. Cl. .................... 13/31
[58] Field of Search ... 13/31; 219/121 EB, 121 EBM

[56] References Cited

U.S. PATENT DOCUMENTS

| 3,390,222 | 6/1968 | Anderson | 13/31 |
| 3,394,217 | 7/1968 | Fisk | 13/31 |
| 3,420,977 | 1/1969 | Hanks et al. | 13/31 X |

Primary Examiner—R. N. Envall, Jr.
Attorney, Agent, or Firm—Stanley Z. Cole; Leon F. Herbert

[57] ABSTRACT

In an electron beam heating and/or evaporator, an electron gun projects a beam of electrons over an arcuate beam path to a crucible containing a target material for heating and/or evaporating the target material in use. The electron beam passes between a pair of generally parallel magnetically permeable pole pieces of a beam focus magnet energized by a primary source of magnetomotive force to produce a main field transverse to the direction of the arcuate electron beam. This main field causes the electron beam to take the arcuate trajectory. An auxiliary electromagnet structure is magnetically coupled between the pole pieces in a region adjacent the electron beam. This auxiliary electromagnet structure includes a first set of windings for skewing the main magnetic field to produce lateral deflection of the beam spot over the target area and a second electromagnetic coil energizable to increase or decrease the intensity of the main field to provide a longitudinal sweep of the beam spot on the target.

7 Claims, 3 Drawing Figures

ELECTRON BEAM HEATING APPARATUS HAVING MEANS FOR SWEEPING THE BEAM SPOT

RELATED CASES

Mutually opposed auxiliary pole pieces disposed adjacent the beam and electromagnetically energized with current for sweeping the beam spot over the crucible are disclosed and claimed in U.S. patent application Ser. No. 658,205 filed Feb. 17, 1976 and assigned to the same assignee as the present invention.

BACKGROUND OF THE INVENTION

The present invention relates in general to electron beam heating and/or evaporating apparatus of the type employing transverse magnetic field focusing to produce an arcuate stream of electrons for bombarding the target and including means for sweeping the beam spot over the target area.

DESCRIPTION OF THE PRIOR ART

Heretofore, electron beam heating and/or evaporating apparatus has been proposed employing the use of an arcuate beam of electrons focused by means of a transverse magnetic field to cause the beam to impact upon a target material in a crucible for heating and/or evaporating the target material.

In addition, these prior systems have included an electromagnet for varying the intensity and shape of the main magnetic field in the region of the electron stream to produce a sweep of the beam spot over the target area. Sweeping the beam spot over the target area allows a larger amount of target material to be utilized and also facilitates thermal stirring of the pool of molten material in the crucible.

Examples of prior art electron beam heating and/or evaporating devices employing magnetic means for sweeping the beam spot over the target area are disclosed in U.S. Pat. Nos. 3,235,647 issued Feb. 15, 1966 and 3,446,934 issued May 27, 1969.

While both of the aforecited prior art systems are suitable for sweeping the beam spot across the target area, these systems are purely electromagnetic and are relatively bulky and complex. A failure of the main electromagnetic coil structure would result in loss of beam focusing and catastrophic failure of the system.

In addition, prior art systems have included an electromagnet for varying the intensity and shape of the main magnetic field in the region of the electron stream to produce a sweep of the beam spot over the target area. Sweeping the beam spot over the target area allows a larger amount of target material to be utilized and also facilitates thermal stirring of the pool of molten material in the crucible.

In another prior art device, the beam sweep structure, for sweeping the beam both laterally and longitudinally of the crucible, included a generally U-shaped magnetic core structure with the electron beam being generally centrally disposed of the U-shaped magnetic structure. A magnetic gap was provided between the two side legs of the U-shaped structure and the parallel faces of the adjacent pole pieces of the main transverse beam focus permanent magnet. Coils were wound on the two legs and on the interconnecting member. Energizing the coil on the interconnecting member served to increase or decrease the magnetic field in the gap, thereby sweeping the beam spot longitudinally of the crucible. Separately energizing either of the side leg portions relative to the other produced a skewing of the total transverse field in the region of the beam from one direction to the other, thereby providing lateral sweeping of the beam spot over the target crucible.

While these aforecited prior art systems are suitable for sweeping the beam spot across the target area they are relatively bulky and complex.

SUMMARY OF THE PRESENT INVENTION

The principal object of the present invention is the provision of an improved electron beam heating and/or evaporating apparatus having improved means for sweeping the beam spot over the target material.

In one feature of the present invention, an auxiliary magnet structure is magnetically coupled between the pole pieces of the beam focusing structure and means are provided for energizing the auxiliary magnet structure to cause opposite ends of the auxiliary magnet structure which are adjacent opposite poles of the main pole pieces to have like magnetic polarity opposite to the polarity of the central region of the auxiliary magnetic structure, whereby the main beam focus transverse field is skewed to produce lateral deflection of the beam spot on the target.

In another feature of the present invention, an auxiliary magnet structure is magnetically coupled between the main pole pieces of the main transverse magnetic beam focus magnet. The auxiliary magnet structure is energized so that opposite ends of the auxiliary structure which are adjacent opposite poles of the main pole pieces have poles of opposite sign, whereby the main beam focus transverse magnetic field is varied in intensity to produce longitudinal deflection of the beam spot on the target.

In another feature of the present invention, the auxiliary beam sweeping magnetic structure includes a magnetically permeable member coupled between the main pole pieces said auxiliary magnetic member having a centrally disposed transverse nonmagnetic gap therein to increase the magnetic reluctance of the auxiliary magnetic member to avoid saturation thereof.

Other features and advantages of the present invention will become apparent upon a perusal of the following specification taken in connection with the accompanying drawings wherein:

DESCRIPTION OF THE PREFERRED EMBODIMENTS

Figure 1:
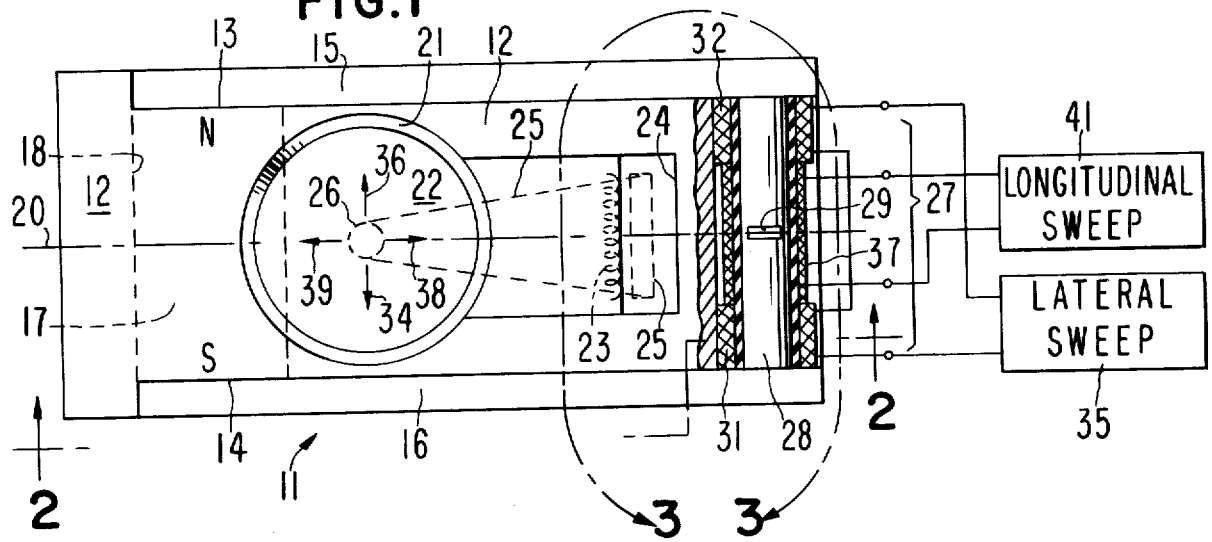
FIG. 1 is a top elevational view, partly broken away and partly in block diagram form, of an electron beam heater and/or evaporator incorporating features of the present invention.
Figure 2:
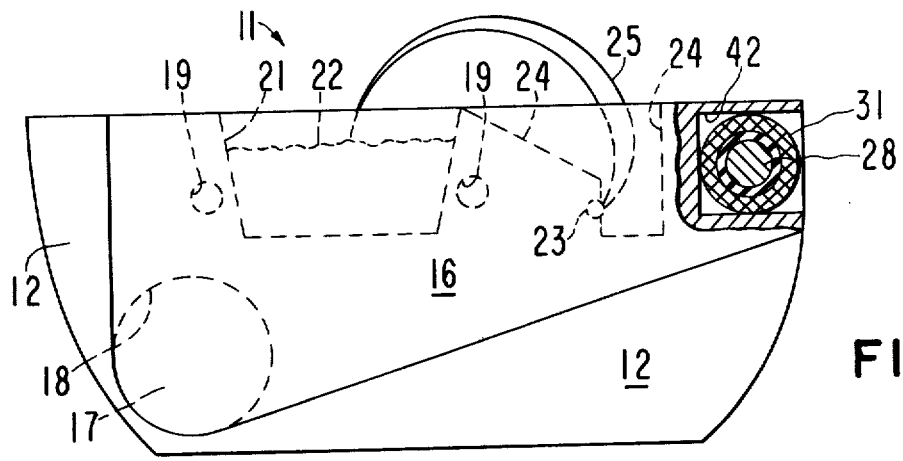
FIG. 2 is a side elevational view, partly in section, of FIG. 1 taken along line 2—2 in the direction of the arrows.

Referring now to FIGS. 1 and 2 there is shown an electron beam heater and/or evaporator 11, hereinafter referred to as heater, having features of the present invention. The electron beam heater 11 includes a solid block 12 of thermally conductive metallic material, as of copper. The opposite sides of the conductive block 12 are recesssed at 13 and 14 to receive magnetic pole piece structures or plates 15 and 16, as of magnetic stainless steel or nickel plated cold-rolled steel. The pole piece structures 15 and 16 are energized with magnetic flux by means of a transversely directed permanent magnet 17 interconnecting the pole pieces 15 and 16 and passing through a circular transverse bore 18 in the copper block 12.

A conical recess 21 in the upper side of the copper block 12 serves as a crucible 21 for containing a material 22 to be evaporated. Water coolant channels 19 course through the copper block for cooling same in use.

A thermionic directly heated filamentary cathode emitter 23 is contained in the block body structure 12 and the block is recessed at 24 to provide an anode structure operated at ground potential. The walls of the recess 24 cooperate with a high negative potential, as of −6 to −14 kV, applied to the filamentary cathode 23 for projecting a ribbon shaped beam of electrons 25 from the cathode 23 through the recess 24 and into an arcuate beam path to the crucible 21. The electrical potential applied between the filamentary cathode 23 and the recessed walls 24 of the body, in cooperation with a strong transverse magnetic field produced between the planar pole structures 15 and 16, causes the beam to take the arcuate path to the crucible. In addition, the fringing magnetic field over the top surface of the block 12 has a certain outwardly bowed curvature which facilitates focusing of the electron beam 25 into a beam spot 26 in the crucible 21. The beam path is generally in the midplane 20 of the pole pieces and normal to the direction of the magnetic field.

The beam focus magnetic structure includes an auxiliary electromagnet structure 27 disposed at the electron gun end of the pole pieces 15 and 16 and extending therebetween. The auxiliary electromagnet 27 serves to provide longitudinal and lateral sweeping of the beam spot 26 over the surface area of the target material 22 to produce thermal stirring of the material 22 being heated or evaporated and allowing a larger quantity of material to be heated or evaporated.

Figure 3:
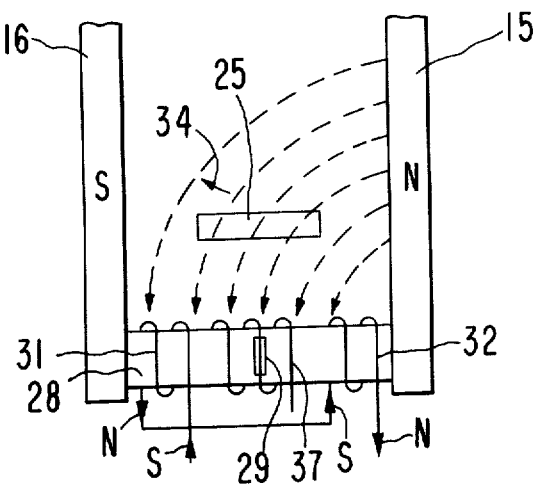
FIG. 3 is a schematic top elevational view of a portion of the structure of FIG. 1 delineated by line 3—3.

The auxiliary electromagnet sweep apparatus includes a magnetically permeable core member 28, as of soft iron, extending between the pole pieces 15 and 16. The core member 28 includes a centrally disposed transverse gap 29 therein to provide a high reluctance gap to prevent saturation of the magnetic member 28. A pair of electrical coils 31 and 32 are wound on opposite ends of the core member 28 and are electrically connected together to be energized in magnetic field bucking relation, as shown in FIG. 3, so that when the current is flowing through the coils 31 and 32 in the direction as shown in FIG. 3 opposite ends of the core member 28 are polarized with north poles and the central region is polarized with a south pole. In such a case, assuming that the main pole pieces 15 and 16 are polarized as shown in FIG. 3, the main magnetic field in the gap between the main pole pieces 15 and 16 in the region of the electron beam 25 will be skewed to produce a lateral deflection of the electron beam 25 in the direction as indicated by the arrow 34.

Conversely, when the current energizing the auxiliary coils 31 and 32 flows in the opposite direction to that shown, opposite ends of the core member 28 will be polarized with south poles and the central region will be polarized with a north pole to produce a skewing of the main transverse magnetic field in the region of the ribbon shaped beam 25 to cause a lateral deflection of the beam 25 in the direction of arrow 36 which is opposite to that of the direction indicated by arrow 34. A lateral sweep generator 35 is connected to the coils 31 and 32 for applying an alternating current to the lateral sweep coils 31 and 32 to cause the beam spot 26 to sweep back and forth in the lateral direction as indicated by arrows 34 and 36. in FIG. 1.

A second electrical coil 37 is wound in the central region of the core 28 and preferably in symmetrical relation relative to the high reluctance gap 29. The auxiliary coil 37 is energized with current to produce opposite magnetic poles at opposite ends of the core member 28. This magnetic field component produced by coil 37 serves to either add to or subtract from the main magnetic field without producing skewing thereof. An increase in the intensity of the transverse magnetic field causes the beam spot 26 to move toward the electron gun as indicated by arrow 38, whereas a decrease in the main transverse magnetic field produced by coil 37 causes the beam spot to move away from the electron gun as indicated by arrow 39. Thus, auxiliary coil 37 serves to produce a longitudinal sweeping of the beam spot 26 when energized with alternating current supplied from a longitudinal sweep source 41 connected to opposite ends of the coil 37.

The auxiliary sweeping electromagnetic coil structure 27 is disposed within a rectangular recess 42 in the block body 12.

The advantage of the electromagnetic beam spot sweep apparatus of the present invention is that it is relatively simple and compact while providing both longitudinal and lateral sweeping of the beam spot over the target material 22. In addition, it is independent of the main field generating means so that an electrical failure of the sweep coil circuit means only that the beam spot 26 will not be swept over the sample material. This is to be contrasted with certain of the aforementioned prior art references wherein a failure of the electromagnetic sweep circuitry could result in loss of the main field and thus the electron beam could be directed into unwanted places so as to cause destruction of the system.

What is claimed is:
1. In an electron beam heating apparatus:
electron gun means for forming and projecting a beam of electrons over a predetermined arcuate beam path to a target material for heating thereof;
magnetic beam focus means having a pair of main pole piece structures on opposite sides of the arcuate beam path for producing a beam focusing main magnetic field having a substantial vector component at right angles to midplane between the pole piece structure to produce bending of the beam into the arcuate beam path;
a main source of magnetomotive force is magnetically coupled between said pair of pole piece structures for energizing said main pole piece structures with magnetic potentials of opposite sign; and
sweeping means operatively associated with said magnetic beam focus means for sweeping the beam spot over the target material, said sweeping means including, a unitary auxiliary magnetically permeable structure magnetically coupled between and extending between said pair of main pole piece structures and having a gap of relatively high magnetic reluctance centrally disposed thereof, electrical coil means magnetically coupled to said auxiliary magnetically permeable structure for energizing said auxiliary magnetic structure in magnetic flux bucking relation so that the opposite ends of said structure adjacent opposite poles of said pair of main pole pieces are energized with component magnetic poles of like sign and the central region is energized with magnetic potential of opposite sign to that of the ends, whereby the main beam focus transverse magnetic field is skewed to produce lateral deflection of the beam spot on the target.

2. The apparatus of claim 1 including, a second electrical coil means magnetically coupled to said auxiliary magnetically permeable structure for energizing said auxiliary magnetic structure so that the opposite ends of said auxiliary magnetic structure adjacent opposite poles of said pair of main pole pieces are energized with component magnetic poles of opposite sign, whereby the main beam focus transverse magnetic field is varied in intensity to produce longitudinal deflection of the beam spot on the target.

3. The apparatus of claim 1 wherein said auxiliary magnetic structure comprises a magnetically permeable nonmagnetically saturated structure extending between said pair of main pole piece structures.

4. The apparatus of claim 3 wherein said auxiliary magnetically permeable nonmagnetically saturated structure comprises a magnetic member having a centrally disposed transverse nonmagnetic gap therein to increase the magnetic reluctance of said member.

5. In an electron beam heating apparatus:
electron gun means for forming and projecting a beam of electrons over a predetermined arcuate beam path to a target material for heating thereof;
magnetic beam focusing means having a pair of main pole piece structures on opposite sides of the arcuate beam path for producing a beam focusing main magnetic field having a substantial vector component at right angles to a midplane between the pole piece structures to produce bending of the beam into the arcuate beam path;
a main source of magnetomotive force magnetically coupled between said pair of main pole piece structures for energizing said main pole piece structures with magnetic potentials of opposite sign; and
sweeping means operatively associated with said magnetic beam focus means for sweeping the beam spot over the target material, said sweeping means including, a unitary auxiliary magnetically permeable structure and magnetically coupled between and extending between said pair of main pole piece structures and having a gap of relatively high magnetic reluctance centrally disposed thereof, electrical coil means magnetically coupled to said auxiliary magnetically permeable structure for energizing said auxiliary magnetic structure so that the opposite ends of said auxiliary magnetic structure adjacent opposite poles of said pair of main pole pieces are energized with component magnetic poles of opposite sign, whereby the main beam focus transverse magnetic field is varied in intensity to produce longitudinal deflection of the beam spot on the target.

6. The apparatus of claim 5 wherein said auxiliary magnetic structure comprises a magnetically permeable nonmagnetically saturated structure extending between said pair of main pole piece structures.

7. The apparatus of claim 6 wherein said auxiliary magnetically permeable nonmagnetically saturated structure comprises a magnetic member having a centrally disposed transverse nonmagnetic gap therein to increase the magnetic reluctance of said member.

* * * * *